(12) United States Patent
Ryu et al.

(10) Patent No.: US 9,892,939 B2
(45) Date of Patent: Feb. 13, 2018

(54) SUBSTRATE TREATING APPARATUS AND CHEMICAL RECYCLING METHOD

(71) Applicant: Semes Co., Ltd., Cheonan-si, Chungcheongnam-do (KR)

(72) Inventors: Jaeryung Ryu, Asan-si (KR); Dong Soon Hwang, Asan-si (KR); Byung Chul Kang, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 931 days.

(21) Appl. No.: 13/664,844

(22) Filed: Oct. 31, 2012

(65) Prior Publication Data
US 2013/0104943 A1 May 2, 2013

(30) Foreign Application Priority Data

Oct. 31, 2011 (KR) .................. 10-2011-0111956
Dec. 9, 2011 (KR) .................. 10-2011-0132108

(51) Int. Cl.
*B08B 3/08* (2006.01)
*H01L 21/67* (2006.01)

(52) U.S. Cl.
CPC .. *H01L 21/67017* (2013.01); *H01L 21/67051* (2013.01)

(58) Field of Classification Search
CPC ............ H01L 21/67017; H01L 21/67051
USPC ....................................... 134/108
See application file for complete search history.

(56) References Cited

U.S. PATENT DOCUMENTS

| 2,210,438 A * | 8/1940 | Adolph ............ C01B 15/03 203/89 |
| 2,672,820 A * | 3/1954 | Hillier ............ F04D 15/0077 122/448.2 |
| 4,841,916 A * | 6/1989 | Sumitomo ............ F22D 1/12 122/32 |
| 6,508,915 B1 * | 1/2003 | Osuda ............ B01D 3/42 159/44 |

FOREIGN PATENT DOCUMENTS

| CN | 86106081 A | 3/1987 |
| CN | 1191192 C | 3/2005 |
| CN | 101935077 A | 1/2011 |

(Continued)

*Primary Examiner* — Michael Barr
*Assistant Examiner* — Tinsae Ayalew
(74) *Attorney, Agent, or Firm* — Harness, Dickey & Pierce, P.L.C.

(57) ABSTRACT

Provided is a substrate treating apparatus. The substrate treating apparatus according to embodiments of the present invention may include a cleaning chamber cleaning foreign objects on a substrate, and a recycling unit recycling by recovering a mixed solution including a first chemical and a second chemical used in cleaning of the substrate, wherein the recycling unit includes a separation unit separating the mixed solution recovered from the cleaning chamber, a recovery line connecting the separation unit and the cleaning chamber and allowing the mixed solution to flow into the separation unit, a decompression line having one end connected to the separation unit and exhausting the mixed solution evaporated from the separation unit, and a decompression unit installed in the decompression line and reducing pressure in the separation unit.

22 Claims, 7 Drawing Sheets

(56) References Cited

FOREIGN PATENT DOCUMENTS

| | | | |
|---|---|---|---|
| JP | 2002-068715 | | 3/2002 |
| JP | 2003-144801 | | 5/2003 |
| JP | 2007-059603 | A | 3/2007 |
| JP | 2010-021215 | | 1/2010 |
| JP | 2010021215 | A * | 1/2010 |
| KR | 10-1998-0064343 | | 10/1998 |
| KR | 10-0771285 | | 10/2007 |
| KR | 10-2008-0101310 | | 11/2008 |
| KR | 10-1308273 | B1 | 9/2013 |
| TW | 555589 | B | 10/2003 |
| TW | 200819397 | A | 5/2008 |
| TW | 200947171 | A | 11/2009 |

* cited by examiner

SUBSTRATE TREATING APPARATUS AND CHEMICAL RECYCLING METHOD

CROSS-REFERENCE TO RELATED APPLICATIONS

This U.S. non-provisional patent application claims priority under 35 U.S.C. § 119 of Korean Patent Application Nos. 10-2011-0111956, filed on Oct. 31, 2011, and 10-2011-0132108, filed on Dec. 9, 2011, the entire contents of which are hereby incorporated by reference.

BACKGROUND

The present invention disclosed herein relates to a substrate treating apparatus treating a substrate, and more particularly, to a substrate treating apparatus recycling chemicals used in cleaning of a substrate and a chemical recycling method.

Various processes, such as photolithography, etching, ashing, ion implantation, and thin film deposition, are performed on a substrate in order to manufacture semiconductor devices or liquid crystal displays. In order to remove contaminants and particles generated in each process, a cleaning process cleaning the substrate is performed before or after performing the each process.

In general, the cleaning process is performed through cleaning the substrate by providing chemicals to the substrate. Chemicals remove foreign objects adhered to the substrate and are then discarded by being discharged outside, or used chemicals are separated by using a difference between boiling points thereof and then recycled. Typically, used chemicals are separated by being heated at an atmospheric pressure. Therefore, since chemicals must be heated at high temperatures so as to allow the chemicals to reach their boiling points, the energy consumed for recycling the chemicals may be relatively large, and thus, efficiency may decrease.

SUMMARY

The present invention provides a substrate treating apparatus recycling chemicals used in cleaning of a substrate and a chemical recycling method.

The present invention also provides a substrate treating apparatus reducing time required for recycling chemicals and a chemical recycling method.

The present invention also provides a substrate treating apparatus reducing costs required for recycling chemicals and a chemical recycling method.

Embodiments of the present invention provide substrate treating apparatuses including: a cleaning chamber cleaning foreign objects on a substrate; and a recycling unit recycling by recovering a mixed solution including a first chemical and a second chemical used in cleaning of the substrate, wherein the recycling unit includes: a separation unit separating the mixed solution recovered from the cleaning chamber; a recovery line connecting the separation unit and the cleaning chamber and allowing the mixed solution to flow into the separation unit; a decompression line having one end connected to the separation unit and exhausting the mixed solution evaporated from the separation unit; and a decompression unit installed in the decompression line and reducing pressure in the separation unit.

In other embodiments of the present invention, methods of recycling chemicals including: introducing a mixed solution include a first chemical and a second chemical used in cleaning of a substrate into a separation unit through a recovery line; exhausting gas and chemicals evaporated from the separation unit by using a decompression pump to heat the mixed solution in the separation unit in a decompressed state; and recovering the first chemical when purity of the first chemical remaining in the separation unit reaches a predetermined level.

In still other embodiments of the present invention, substrate treating apparatuses include: a cleaning chamber cleaning foreign objects on a substrate with a mixed solution of sulfuric acid and hydrogen peroxide; a recovery line recovering the mixed solution used in cleaning of the substrate from the cleaning chamber; a separation unit separating the sulfuric acid by heating the mixed solution recovered; a decompression line discharging the mixed solution evaporated from the separation unit; and a decompression unit reducing pressure of the separation unit to decrease a boiling point of the mixed solution.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE EMBODIMENTS

Hereinafter, embodiments of the present invention will be described in more detain with reference to the accompanying drawings, FIGS. 1 through 7. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Therefore, shapes of the elements in the figures are exaggerated for clarity of illustration.

Figure 1:
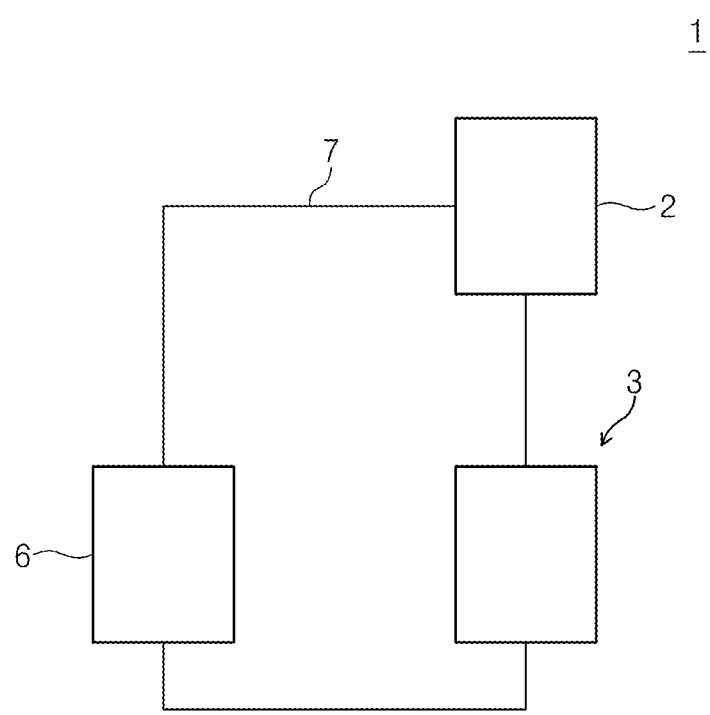
FIG. 1 is a schematic diagram illustrating a substrate treating apparatus according to an embodiment of the present invention.

FIG. 1 is a schematic diagram illustrating a substrate treating apparatus according to an embodiment of the present invention.

Referring to FIG. 1, a substrate treating apparatus 1 includes a cleaning chamber 2, a recycling unit 3, and a chemical supply unit 6.

The chemical supply unit 6 is connected to the cleaning chamber 2 through a supply line 7. The chemical supply unit 6 provides a mixed solution to the cleaning chamber 2 through the supply line 7. The mixed solution includes a first chemical and a second chemical. The first chemical may be one of sulfuric acid, ammonia, or nitric acid. The second chemical may be hydrogen peroxide. Hereinafter, the case that the mixed solution includes sulfuric acid as the first chemical and hydrogen peroxide as the second chemical will be described as an example.

The cleaning chamber 2 cleans a substrate by using the mixed solution supplied from the chemical supply unit 6. The mixed solution used in cleaning of the substrate is recycled to be supplied to the recycling unit 3. A portion of hydrogen peroxide included in the mixed solution becomes water in the process of being supplied to the cleaning chamber 2 and in the process of being recovered after being used in cleaning of the substrate. Therefore, sulfuric acid, hydrogen peroxide, or water may be included in the mixed solution supplied to the recycling unit 3.

The recycling unit 3 separates sulfuric acid from the recovered mixed solution. The recycling unit 3 separates sulfuric acid from the mixed solution so as to have a predetermined purity level and then provides the sulfuric acid to the chemical supply unit 6.

The chemical supply unit 6 provides the sulfuric acid supplied from the recycling unit 3 to the cleaning chamber 2 through the supply line 7.

Figure 2:
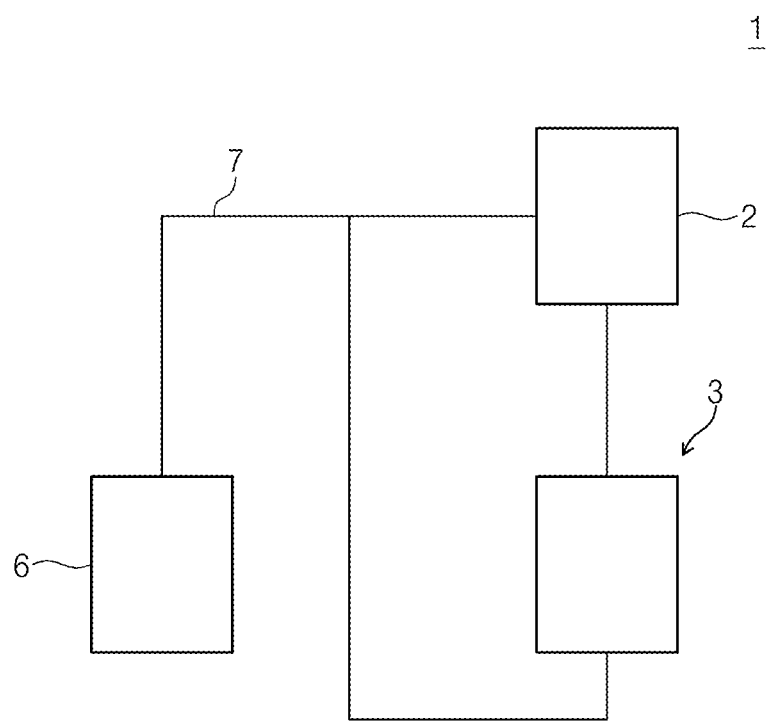
FIG. 2 is a schematic diagram illustrating a substrate treating apparatus according to another embodiment of the present invention.

FIG. 2 is a schematic diagram illustrating a substrate treating apparatus according to another embodiment of the present invention.

Referring to FIG. 2, a recycling unit 3 may directly supply sulfuric acid to a cleaning chamber 2. Therefore, sulfuric acid may be supplied from a chemical supply unit 6 to the cleaning chamber 2, or may be supplied from the recycling unit 3 to the cleaning chamber 2.

Figure 3:
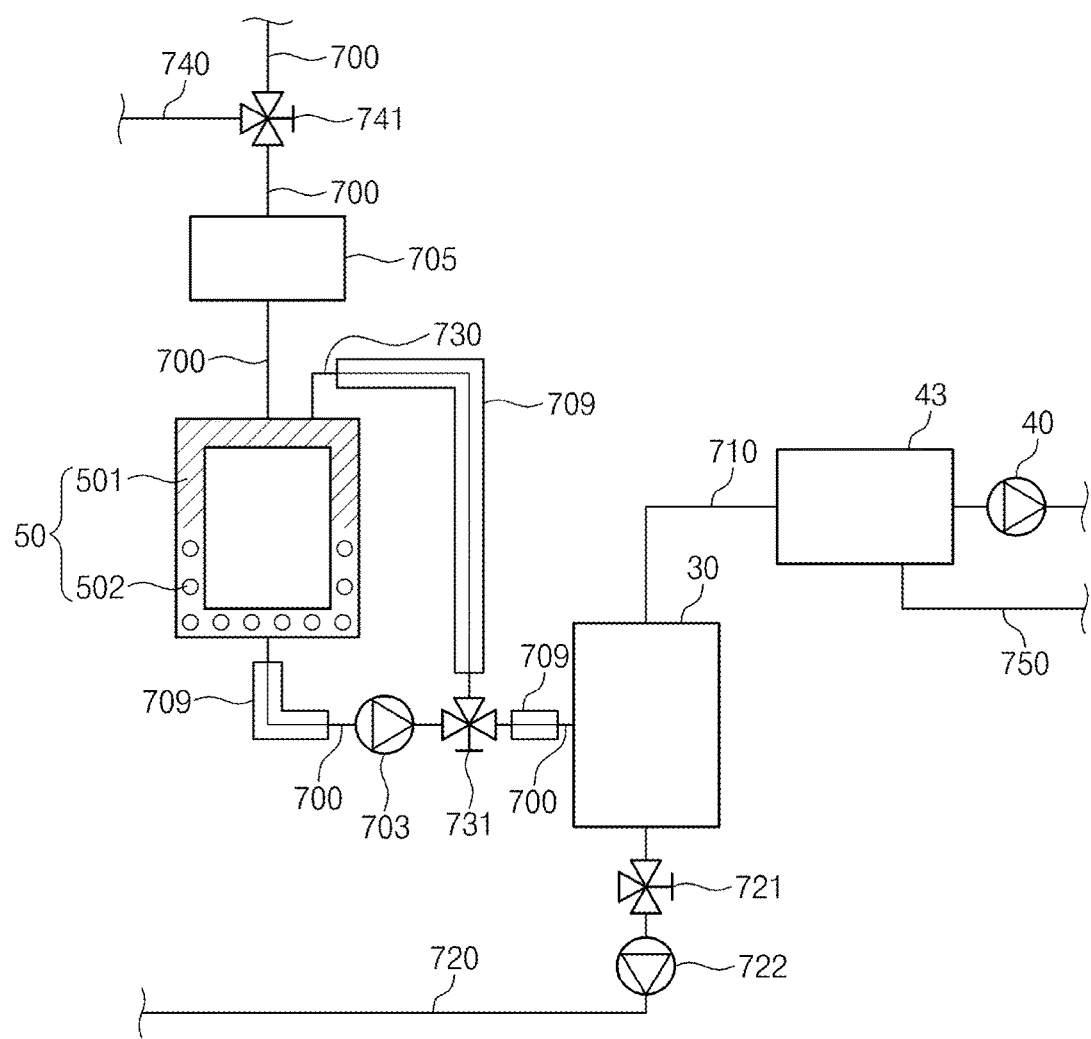
FIG. 3 illustrates a configuration of a recycling unit.

FIG. 3 illustrates a configuration of a recycling unit.

Referring to FIG. 3, the recycling unit 3 includes a separation unit 30, a decompression unit 40, and a preheating unit 50.

The separation unit 30 is connected to each one side of a recovery line 700, a decompression line 710, and a first discharge line 720. The other side of the recovery line 700 is connected to the cleaning chamber 2. Therefore, the mixed solution used in cleaning of the substrate in the cleaning chamber 2 is introduced into the separation unit 30 through the recovery line 700. The separation unit 30 heats the mixed solution when a predetermined amount of the mixed solution is introduced into the inside thereof. When the heating of the mixed solution is continued, hydrogen peroxide and water included in the mixed solution evaporate. Also, a portion of sulfuric acid included in the mixed solution evaporates into fumes.

The decompression unit 40 is installed in the decompression line 710. The decompression unit 40 provides suction pressure to the separation unit 30 through the decompression line 710. Therefore, gas and evaporated mixed solution in the separation unit 30 are exhausted through the decompression line 710 and pressure in the separation unit 30 decreases. When the pressure in the separation unit 30 decreases, a boiling point of the mixed solution decreases. For example, the decompression unit 40 provides pressure to allow the pressure in the separation unit 30 to be maintained within a range of 0.005 bars to 0.025 bars, and the separation unit 30 heats the mixed solution to a temperature within a range of 150° C. to 170° C.

A condenser 43 to be described later is installed between the separation unit 30 and the decompression unit 40 in the decompression line 710.

A discharge value 721 and a discharge pump 722 are installed in the first discharge line 720. The discharge value 721 blocks the circulation of the mixed solution to the first discharge line 720 during the heating of the mixed solution.

Also, the mixed solution is not further introduced into the separation unit 30 while sulfuric acid is separated from the predetermined amount of the mixed solution in the separation unit 30. Hydrogen peroxide and water mainly evaporate during the heating of the mixed solution. Therefore, purity of sulfuric acid included in the mixed solution increases when the heating of the mixed solution and the discharge of the evaporated mixed solution are continued. When the purity of sulfuric acid remaining in the separation unit 30 becomes a predetermined level, the discharge value 721 opens and the discharge pump 722 operates to discharge the sulfuric acid into the first discharge line 720.

The preheating unit 50 is installed in the recovery line 700. The preheating unit 50 includes a housing 501 and a heater 502. The housing 501 provides a space storing the predetermined amount of the mixed solution while constituting the exterior of the preheating unit 50. The heater 502 heats the mixed solution stored in the housing 501.

While the sulfuric acid included in the mixed solution is separated in the separation unit 30, the mixed solution further supplied through the recovery line 700 is stored in the housing 501 and simultaneously, heated by the heater 502. When the sulfuric acid separated from the separation unit 30 is discharged through the first discharge line 720, the mixed solution stored in the housing 501 or the mixed solution supplied from the cleaning chamber 2 is supplied to the separation unit 30. Therefore, when the preheating unit 50 is installed, a temperature of the mixed solution supplied to the separation unit 30 increases and thus, time required for the mixed solution to reach an evaporation temperature may be reduced.

A circulation line 730 is branched from the recovery line 700 connecting the preheating unit 50 and the separation unit 30, and the other end of the circulation line 730 is connected to the preheating unit 50. A first three-way valve 731 is installed where the circulation line 730 is branched from the recovery line 700.

The first three-way valve 731 is controlled to selectively open and close an inlet flow channel to the separation unit 30 or a flow channel connected to the circulation line 730. Therefore, the mixed solution discharged from the preheating unit 50 flows into the separation unit 30 or flows again into the preheating unit 50 through the circulation line 730. While the sulfuric acid included in the mixed solution is separated in the separation unit 30, the three-way valve 731 is controlled to block the recovery line 700 introduced into the separation unit 30 and open the circulation line 730, and thus, the mixed solution may circulate in the housing 501. Therefore, a heat exchange area between the heater 502 and the mixed solution in the preheating unit 50 increases and thus, time required for heating the mixed solution is reduced. For example, the preheating unit 50 heats the mixed solution to a temperature within a range of 100° C. to 160° C.

A pump 703 is installed in the recovery line 700 at a side of the preheating unit 50 having the mixed solution discharged therefrom. The pump 703 makes the circulation of the mixed solution introduced into the separation unit 30 or the circulation line 730 smoothly.

The line heater 502 is installed in the recovery line 700 connecting the preheating unit 50 and the separation unit 30. The line heater 502 is installed so as to be in contact with an outer surface of the recovery line 700 and thus, heats the mixed solution circulating in the recovery line 700. Therefore, the line heater 502 prevents a temperature of the mixed solution discharged from the preheating unit 50 from decreasing during the circulation. Also, since a heat exchange area between the circulating mixed solution and the line heater 502 may become relatively large, a heat exchange efficiency may be improved. Further, the line heater 502 is also installed in the circulation line 730.

A second three-way valve 741 and a filter 705 are installed between the cleaning chamber 2 and the preheating unit 50 in the recovery line 700. A waste line 740 is branched from the recovery line 700 where the second three-way valve 741 is installed. The second three-way valve 741 selectively open and close the recovery line 700 connected to the waste line 740 or the preheating unit 50. The mixed solution introduced into the waste line 740 is discarded. Therefore, a user may recycle or discard the mixed solution by controlling the second three-way valve 741. For example, the user may choose to discard a mixed solution used by mixing sulfuric acid and hydrogen peroxide at a ratio ranging from 1:1 to 1:4 and to recycle a mixed solution used by mixing sulfuric acid and hydrogen peroxide at a ratio ranging from 1:5 to 1:7. The filter 705 filters out foreign objects from the mixed solution introduced into the preheating unit 50.

The condenser 43 may be omitted in the present embodiment.

Also, the circulation line 730 may be omitted in the present embodiment.

Further, the preheating unit 50 may be omitted in the present embodiment.

Figure 4:
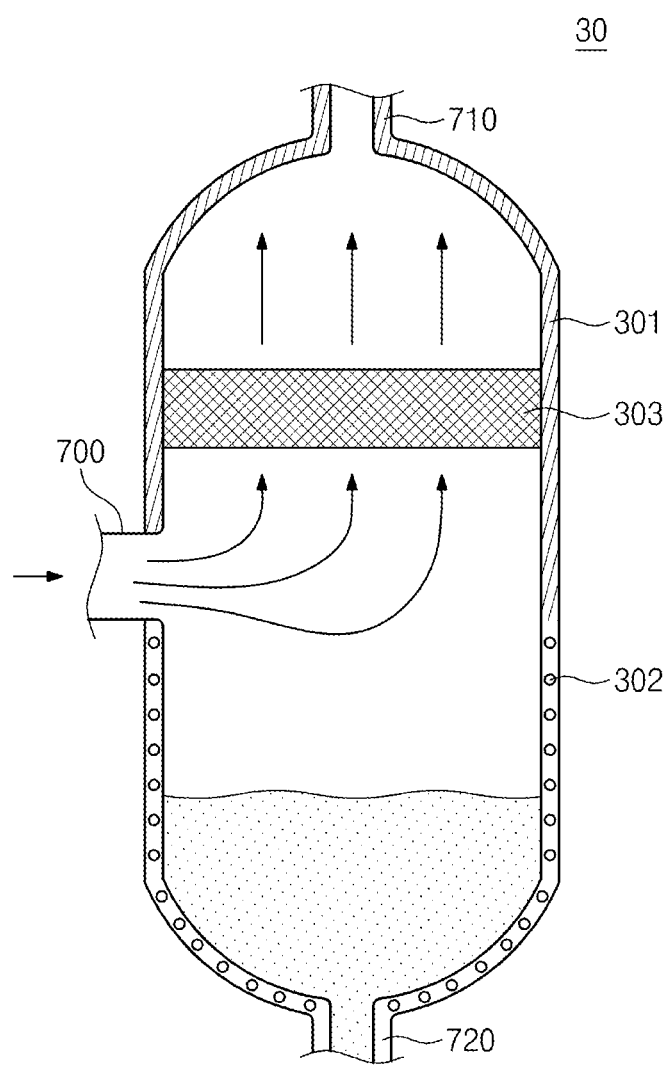
FIG. 4 illustrates a configuration of a separation unit according to an embodiment of the present invention.

FIG. 4 illustrates a configuration of the separation unit 30.

Referring to FIG. 4, the separation unit 30 includes a housing 301, a separation heater 302, and a filtering member 303.

The housing 301 provides a space storing a predetermined amount of the mixed solution. The filtering member 303 is installed in the housing 301. The filtering member 303 is provided as a porous material. When the filtering member 303 is provided, an inside of the housing is divided into an upper space and a lower space. The recovery line 700 and the first discharge line 720 are connected to the lower space and the decompression line 710 is connected to the upper space, respectively. Also, the first discharge line 720 is connected to the down side of the recovery line 700.

The separation heater 302 is installed to be able to transfer heat to the housing 301. The separation heater 302 is installed at the inside, an inner wall, or an outer wall of the housing 301. When the separation heater 302 is operated, the mixed solution introduced into the housing 301 is heated to evaporate. The evaporated mixed solution passes through the filtering member 303 and then moves to the decompression line 710. Sulfuric acid is filtered from the evaporated mixed solution during the process of passing through the filtering member 303. That is, the evaporated mixed solution collides with the filtering member 303 while passing through the filtering member 303. A portion of the evaporated mixed solution adheres to the filtering member 303 due to viscosity during the process of colliding with the filtering member 303. When the evaporation continues, the mixed solution adhered to the filtering member 303 is agglomerated and then drops downward due to gravity.

Sulfuric acid particles included in the evaporated mixed solution have a size larger than that of hydrogen peroxide or water and have a viscosity higher than that of hydrogen peroxide or water. Accordingly, when the evaporated mixed solution collides with the filtering member 303, an amount of sulfuric acid adhered to the filtering member 303 is greater than that of hydrogen peroxide or water adhered to the filtering member 303. Therefore, an amount of sulfuric acid included in the mixed solution dropping from the filtering member 303 is greater than that of hydrogen peroxide or water included therein.

Figure 5:
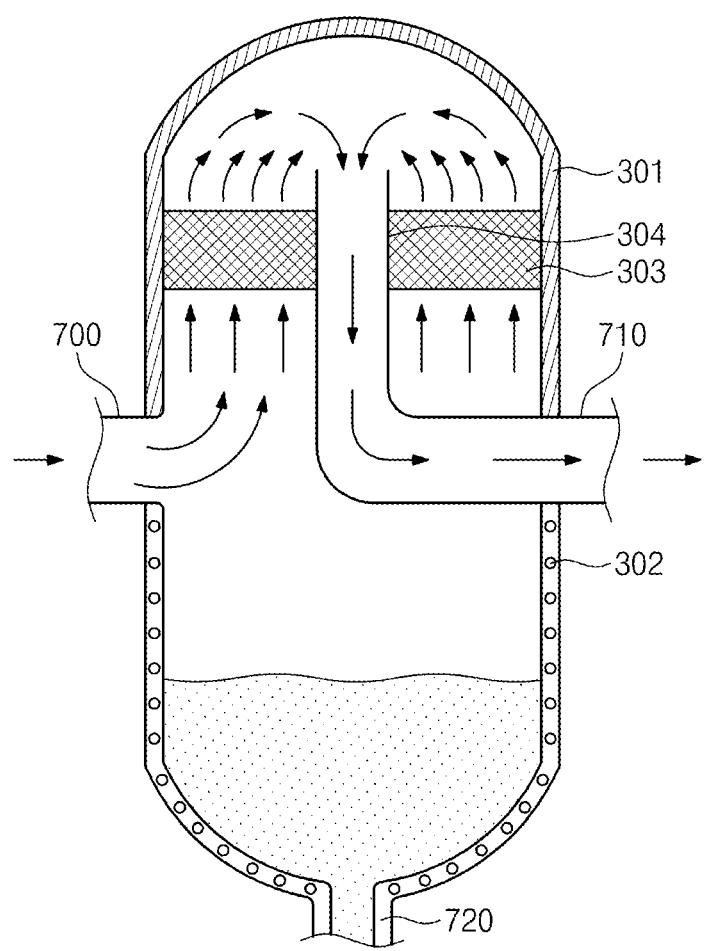
FIG. 5 illustrates a configuration of a separation unit according to another embodiment of the present invention.

FIG. 5 illustrates a configuration of a separation unit according to another embodiment of the present invention.

Referring to FIG. 5, a decompression line 710 is connected to an upper space across a lower space. That is, the decompression line 710 is formed by extending from the lower space to the upper space in a housing 301 and is connected to the upper space through a hole 304 formed in a filtering member 303. Therefore, a position at which the decompression line 710 is connected to the outside of the housing 301 is not limited to a position where the upper space is formed. Thus, the position of the decompression line 710 connected to the separation unit 30 may be changed.

Figure 6:
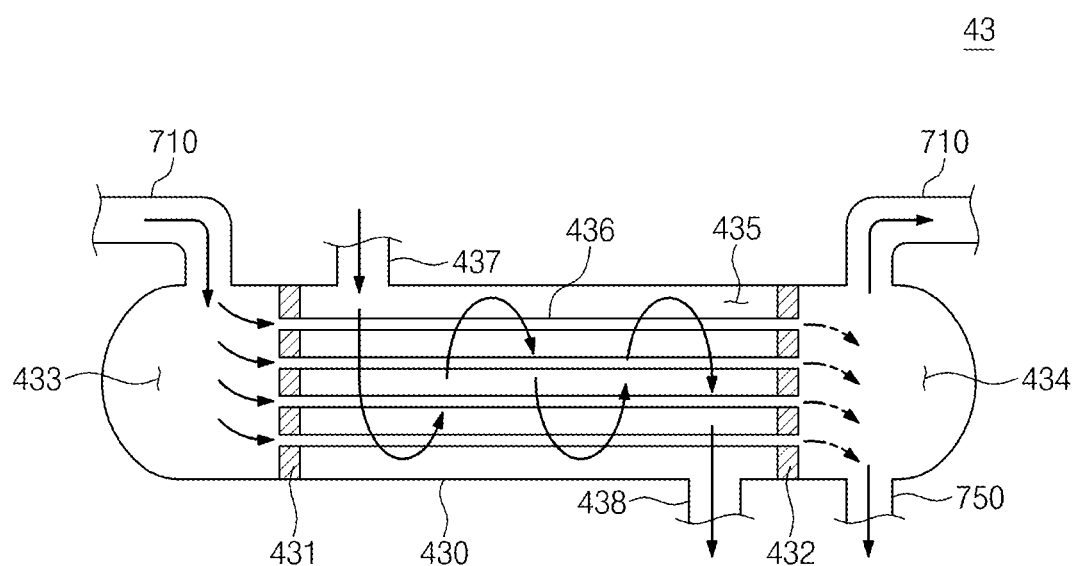
FIG. 6 illustrates a configuration of a condenser.

FIG. 6 illustrates a configuration of a condenser.

Referring to FIG. 6, the condenser 43 includes a housing 430, a first partition member 431, a second partition member 432, and connecting pipes 436.

The first partition member 431 and the second partition member 432 are installed in the housing 430 constituting the exterior of the condenser 43 to form an inlet space 433, a cooling space 435, and an outlet space 434. The decompression line 710 through which the mixed solution flows in is connected to the inlet space 433. The decompression line 710 through which the mixed solution flows out and the second discharge line 750 are connected to the outlet space 434. The second discharge line 750 is connected to the downside of the decompression line 710 through which the mixed solution flows out. The connecting pipes 436 are installed across the cooling space 435 to connect the inlet space 433 and the outlet space 434. Also, a coolant inlet pipe 437 and a coolant outlet pipe 438 are connected to the cooling space 435.

The evaporated mixed solution introduced into the inlet space 433 circulates to the outlet space 434 through the connecting pipes 436. Also, the coolant introduced from the coolant inlet pipe 437 circulates the cooling space 435 and then discharged to the coolant outlet pipe 438. The evaporated mixed solution circulating the connecting pipes 436 condenses during the process of heat exchange with the low-temperature coolant circulating the cooling space 435 and thus, a portion thereof becomes a liquid phase. The liquid-phase mixed solution circulates from the outlet space 434 to the second discharge line 750 and a gas-phase mixed solution circulates to the decompression line 710. The mixed solution circulated to the second discharge line 750 and the decompression line 710 is discarded.

Since a boiling point of the sulfuric acid included in the evaporated mixed solution is higher than those of the hydrogen peroxide and water included in the evaporated mixed solution, the sulfuric acid is easily liquefied than the hydrogen peroxide and water included in the mixed solution. Therefore, an amount of the sulfuric acid included in the mixed solution circulating from the outlet space 434 to the second discharge line 750 is larger than that included in the mixed solution circulating from the outlet space 434 to the decompression line 710. Since the amount of the sulfuric acid introduced into the decompression unit 40 decreases, corrosion of the decompression unit 40 due to sulfuric acid is prevented.

Also, an amount of the evaporated mixed solution introduced into the decompression unit 40 decreases to reduce a load applied to the decompression unit 40 and thus, energy consumed in the decompression unit 40 decreases.

Figure 7:
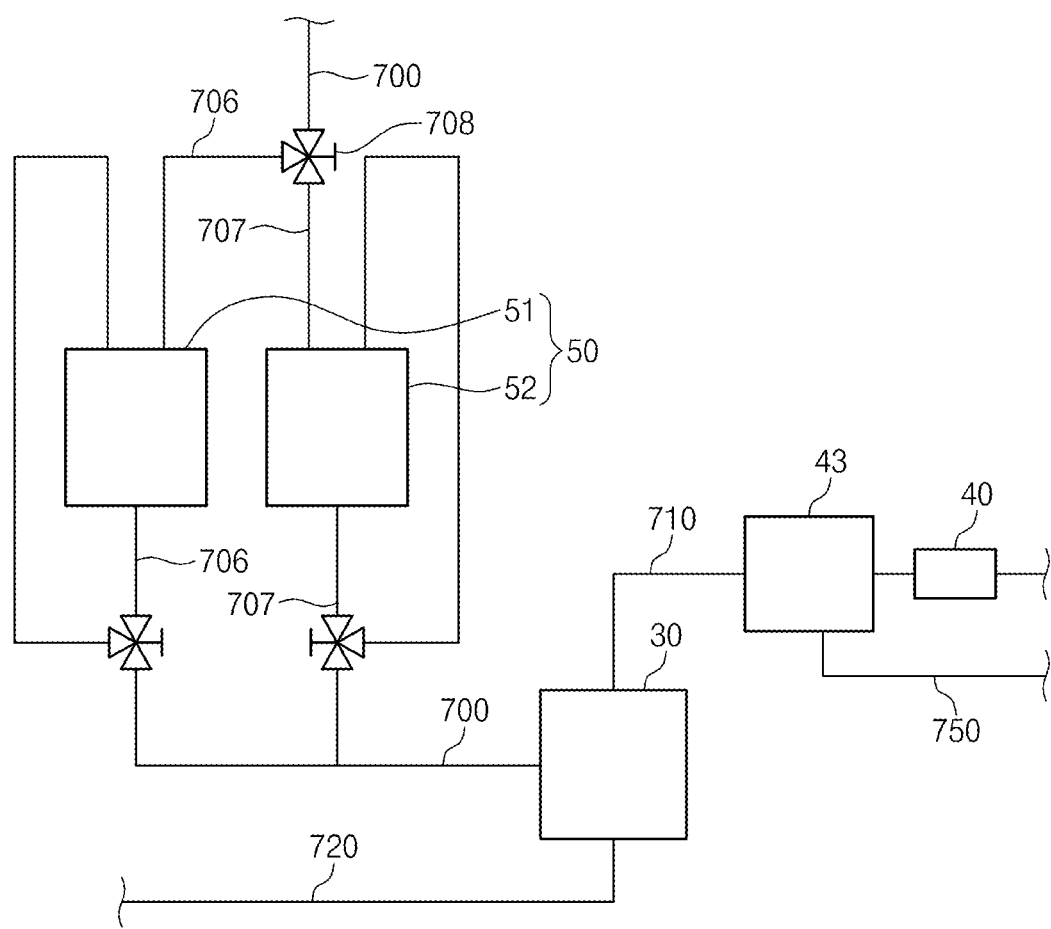
FIG. 7 illustrates a configuration of a preheating unit according to another embodiment of the present invention.

FIG. 7 illustrates a configuration of a preheating unit according to another embodiment of the present invention.

Referring to FIG. 7, two preheating units 50 are provided in parallel. A recovery line 700 is branched in parallel into a first branch line 706 and a second branch line 707. A first preheating unit 51 and a second preheating unit 52 are installed in the first branch line 706 and the second branch line 707, respectively. Also, a third three-way valve 708 is installed where the recovery line 700 is branched.

The third three-way valve 708 is controlled to allow the mixed solution introduced from the recovery line 700 to selectively flow into the first branch line 706 and the second branch line 707. Thus, the mixed solution introduced through the recovery line 700 flows into the first preheating unit 51 or the second preheating unit 52. Therefore, each of the first preheating unit 51 and the second preheating unit 52 may heat a predetermined amount of the mixed solution at a predetermined temperature.

According to the present invention, chemicals used in cleaning of a substrate may be recycled.

Also, according to the present invention, time required for recycling the chemicals used in cleaning of a substrate may be reduced.

Further, according to the present invention, costs required for recycling the chemicals used in cleaning of a substrate may be reduced.

The above detailed descriptions exemplify the present invention. Although the exemplary embodiments of the present invention have been described, the present invention may also be used in various other combinations, modifications, and environments. In other words, various modifications and variations can be made in the present invention without departing from the scope of the inventive concept disclosed in the present specification, the scope equivalent to the disclosure and/or the scope of technique or knowledge in the art. The exemplary embodiments have been provided to describe the best state for implementing the technical idea of the present invention and various modifications required for specific application areas and usages of the present invention can be made. Therefore, the scope of the invention is defined not by the detailed description of the invention but by the appended claims, and all differences within the scope will be construed as being included in the present invention.

What is claimed is:

1. A substrate treating apparatus comprising:
    a cleaning chamber configured to clean foreign objects on a substrate; and
    a recycling device configured to recycle by recovering a mixed solution including a first chemical and a second chemical used in cleaning of the substrate, the recycling device including,
        a separating device configured to separate the mixed solution recovered from the cleaning chamber, the separating device including a separation heater configured to evaporate the mixed solution within an evaporation time,
        a recovery line configured to connect the separating device and the cleaning chamber to allow the mixed solution to flow from the cleaning chamber into the separating device,
        a decompression line having one end connected to the separating device, the decompression line being configured to exhaust the mixed solution evaporated from the separating device,
        a decompressor in the decompression line, the decompressor being configured to reduce a boiling point of the mixed solution in the separating device by reducing pressure in the separating device containing same to create a decompressed state and reduce an evaporation time of same, and
        a pre-heater in the recovery line between the cleaning chamber and the separating device such that a first end of the pre-heater is connected to the cleaning chamber and a second end of the pre-heater is connected to the separating device, the pre-heater configured to heat the mixed solution before the mixed solution flows into the separation device to reduce the evaporation time, the first end and the second end of the pre-heater being connected via a circulation line such that the circulation line directs the mixed solution discharged from the second end of the pre-heater to flow again into the first end of the pre-heater without flowing through the cleaning chamber.

2. The substrate treating apparatus of claim 1, further comprising:
    a condenser in the decompression line, and between the separating device and the decompressor.

3. The substrate treating apparatus of claim 2, wherein a second discharge line discharging the evaporated mixed solution condensed in the condenser is connected to the condenser.

4. The substrate treating apparatus of claim 1, wherein the pre-heater includes:
    a housing configured to store the mixed solution, and
    a heater configured to heat the mixed solution stored in the housing.

5. The substrate treating apparatus of claim 4, wherein a line heater is between the pre-heater and the separating device in the recovery line.

6. The substrate treating apparatus of claim 4, wherein the recovery line is branched in parallel into a first branch line and a second branch line, the first branch line having a first pre-heater and the second branch line having a second pre-heater.

7. The substrate treating apparatus of claim 1, wherein the recycling device further comprises;
    a first discharge line having one end connected to the separating device to discharge the first chemical separated from the separating device.

8. The substrate treating apparatus of claim 7, wherein the first discharge line is connected to the cleaning chamber or a chemical supply unit supplying the first chemical to the cleaning chamber.

9. The substrate treating apparatus of claim 1, wherein a filtering member is in the separating device.

10. The substrate treating apparatus of claim 9, wherein an inside of the separating device is divided into an upper space and a lower space by the filtering member, the recovery line is directly connected to the lower space, and the decompression line is directly connected to the upper space.

11. The substrate treating apparatus of claim 9, wherein
    an inside of the separating device is divided into an upper space and a lower space by the filtering member,
    the recovery line is directly connected to the lower space, and the decompression line is directly connected to the upper space through a hole in the filtering member,
    the recovery line and the decompression line are connected to the separating device such that the recovery line and the decompression line are on a downside of the filtering member, and
    an inner line connecting an upside of the filtering member and the decompression line is in the separating device.

12. The substrate treating apparatus of claim 1, wherein the first chemical is sulfuric acid and the second chemical includes hydrogen peroxide or water.

13. The substrate treating apparatus of claim 1, wherein the first chemical is one of sulfuric acid, ammonia, or nitric acid.

14. A method of recycling chemicals, the method comprising:
heating a mixed solution in a pre-heater before the mixed solution flows into a separating device to reduce the evaporation time, the pre-heater being between a cleaning chamber and the separating device in a recovery line such that a first end of the pre-heater is connected to the cleaning chamber and a second end of the pre-heater is connected to the separating device, the mixed solution including a first chemical and a second chemical, the first end and the second end of the pre-heater being connected via a circulation line such that the circulation line directs the mixed solution discharged from the second end of the pre-heater to flow again into the first end of the pre-heater without flowing through the cleaning chamber;
introducing the mixed solution used in cleaning of a substrate into the separating device through the recovery line;
reducing, via a decompressor, a boiling point of the mixed solution pressure in the separating device by reducing pressure in the separating device containing same to create a decompressed state and reduce and an evaporation time of same; and
heating, by a separating heater, the separating device while in the decompressed state to evaporate the mixed solution such that the mixed solution evaporates within the evaporation time;
exhausting gas and chemicals evaporated from the separating device using a decompression pump; and
recovering the first chemical when purity of the first chemical remaining in the separating device reaches a set level.

15. The method of claim 14, further comprising:
condensing the evaporated chemicals while the chemicals evaporated from the separating device flow to a decompressor.

16. The method of claim 14, wherein the pre-heater heats the mixed solution at a temperature within a range of 100° C. to 160° C.

17. The method of claim 14, wherein the first chemical is sulfuric acid and the second chemical includes hydrogen peroxide or water.

18. The method of claim 17, wherein the mixed solution is used by mixing the sulfuric acid and the hydrogen peroxide at a ratio ranging from 1:5 to 1:7.

19. The method of claim 14, wherein the reducing the boiling point comprises:
decompressing the separating device at a pressure ranging from 0.005 bars to 0.025 bars and heating the mixed solution in the separating device to a temperature ranging from 150° C. to 170° C.

20. The method of claim 14, wherein the first chemical is one of sulfuric acid, ammonia, or nitric acid.

21. A substrate treating apparatus comprising:
a cleaning chamber configured to clean foreign objects on a substrate with a mixed solution of sulfuric acid and hydrogen peroxide;
a recovery line configured to recover the mixed solution used in cleaning of the substrate from the cleaning chamber;
a separating device configured to separate the sulfuric acid by heating the mixed solution recovered and evaporating same within an evaporation time;
a decompression line configured to discharge the mixed solution evaporated from the separating device;
a decompressor configured to reduce pressure of the separating device to decrease a boiling point of the mixed solution in the separating device and reduce the evaporation time; and
a pre-heater in the recovery line between the cleaning chamber and the separating device such that a first end of the pre-heater is connected to the cleaning chamber and a second end of the pre-heater is connected to the separating device, the pre-heater configured to heat the mixed solution before the mixed solution flows into the separating device to reduce the evaporating time, the first end and the second end of the pre-heater being connected via a circulation line such that the circulation line directs the mixed solution discharged from the second end of the pre-heater to flow again into the first end of the pre-heater without flowing through the cleaning chamber.

22. The substrate treating apparatus of claim 21, further comprising:
a condenser configured to condense the evaporated mixed solution discharged into the decompressor.

* * * * *